(12) United States Patent
Lee

(10) Patent No.: US 9,024,307 B2
(45) Date of Patent: May 5, 2015

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventor: Kwan Hee Lee, Gyeonggi-do (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/224,707

(22) Filed: Mar. 25, 2014

(65) Prior Publication Data

US 2015/0008398 A1    Jan. 8, 2015

(30) Foreign Application Priority Data

Jul. 4, 2013 (KR) .................. 10-2013-0078420

(51) Int. Cl.
*H01L 35/24* (2006.01)
*H01L 51/52* (2006.01)
*H01L 27/32* (2006.01)
*H01L 51/56* (2006.01)

(52) U.S. Cl.
CPC ........ *H01L 51/5228* (2013.01); *H01L 27/3211* (2013.01); *H01L 51/56* (2013.01)

(58) Field of Classification Search
USPC ............................. 257/40, E51.001
See application file for complete search history.

(56) References Cited

U.S. PATENT DOCUMENTS

2005/0179374 A1* 8/2005 Kwak ................... 313/506

FOREIGN PATENT DOCUMENTS

| KR | 1020050098596 | 10/2005 |
| KR | 1020100106366 | 10/2010 |
| KR | 1020100128020 | 12/2010 |

* cited by examiner

*Primary Examiner* — Anthony Ho
(74) *Attorney, Agent, or Firm* — F. Chau & Associates, LLC

(57) ABSTRACT

An organic light-emitting display device includes a plurality of anodes and an auxiliary electrode disposed on the substrate. The auxiliary electrode is separated from the plurality of the anodes. The organic light-emitting display device further includes an organic layer disposed on the plurality of the anodes, an opening penetrating the organic layer to expose the auxiliary electrode, and a cathode disposed on the organic layer and the exposed auxiliary electrode. The cathode is electrically connected to the auxiliary electrode. The opening has a first width at a proximal end and a second width at a distal end. The distal end is closer to the auxiliary electrode than the proximal end. The first width is smaller than the second width.

14 Claims, 13 Drawing Sheets

ORGANIC LIGHT-EMITTING DISPLAY DEVICE AND METHOD OF MANUFACTURING THE SAME

This application claims priority under 35 U.S.C. §119 to Korean Patent Application No. 10-2013-0078420, filed on Jul. 4, 2013 in the Korean Intellectual Property Office, the disclosure of which is incorporated by reference herein in its entirety.

TECHNICAL FIELD

The present invention relates to an organic light-emitting display device and a method of manufacturing the same.

DISCUSSION OF RELATED ART

Organic light-emitting display devices include a plurality of pixels. Each pixel includes a first electrode, a second electrode, and an organic layer disposed between the first electrode and the second electrode. The organic layer may emit light having a luminance level corresponding to an electric current flowing between the first electrode and the second electrode. The organic light-emitting display devices display a desired image by controlling the electric current flowing between the first electrode and the second electrode.

SUMMARY OF THE INVENTION

According to an exemplary embodiment of the present invention, an organic light-emitting display device includes a plurality of anodes and an auxiliary electrode disposed on the substrate. The auxiliary electrode is separated from the plurality of the anodes. The organic light-emitting display device further includes an organic layer disposed on the plurality of the anodes, an opening penetrating the organic layer to expose the auxiliary electrode, and a cathode disposed on the organic layer and the exposed auxiliary electrode. The cathode is electrically connected to the auxiliary electrode. The opening has a first width at a proximal end and a second width at a distal end. The distal end is closer to the auxiliary electrode than the proximal end. The first width is smaller than the second width.

According to an exemplary embodiment of the present invention, an organic light-emitting display device includes a substrate including a display area and a non-display area. The organic light-emitting display device further includes a plurality of anodes on the display area of the substrate. The organic light-emitting display device further includes an auxiliary electrode disposed on both the display area and the non-display area of the substrate. The auxiliary electrode is separated from the plurality of the anodes. An organic layer is disposed on the plurality of the anodes. An opening penetrates the organic layer to expose the auxiliary electrode. The organic light-emitting display further includes a cathode disposed on the organic layer and the exposed auxiliary electrode. The auxiliary electrode includes end portions disposed in the non-display area.

According to an exemplary embodiment of the present invention, a method of manufacturing an organic light-emitting display device is provided. A plurality of anodes and an auxiliary electrode are formed on a substrate. The auxiliary electrode is separated from the plurality of the anodes. An organic layer is formed on the plurality of the anodes and the auxiliary electrode. An opening is formed in the organic layer by applying a voltage to the auxiliary electrode. The opening exposes the auxiliary electrode. A cathode is formed on the organic layer and the exposed auxiliary electrode. The cathode is electrically connected to the exposed auxiliary electrode.

BRIEF DESCRIPTION OF THE DRAWINGS

These and other features of the present invention will become more apparent by describing in detail exemplary embodiments thereof with reference to the accompanying drawings of which.

DETAILED DESCRIPTION OF THE EXEMPLARY EMBODIMENTS

Figure 1:
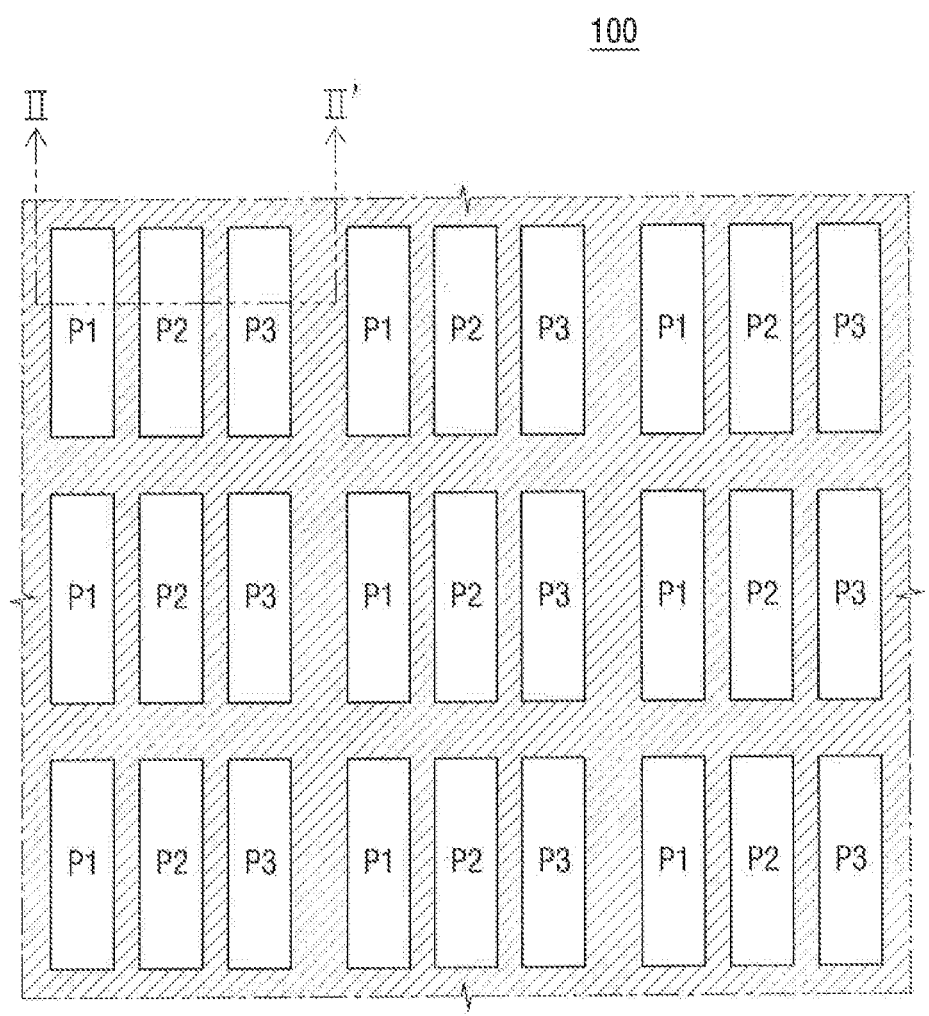
FIG. 1 is a plan view of an organic light-emitting display device according to an exemplary embodiment of the present invention.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a plan view of an organic light-emitting display device 100 according to an exemplary embodiment of the present invention.

Referring to FIG. 1, the organic light-emitting display device 100 includes a plurality of pixels (P1, P2, P3). Each of the pixels (P1, P2, P3) emits light, and the organic light-emitting display device 100 displays an image by controlling the luminance of light emitted from each of the pixels (P1, P2, P3). The pixels (P1, P2, P3) are arranged in a matrix pattern, but the arrangement pattern of the pixels (P1, P2, P3) is not limited to the matrix pattern.

The pixels (P1, P2, P3) include first pixels P1, second pixels P2, and third pixels P3. The first through third pixels P1 through P3 may emit light of different colors. In an example, the first pixels P1 may emit red light, the second pixels P2 may emit green light, and the third pixels P3 may emit blue light. However, the present invention is not limited thereto. One first pixel P1, one second pixel P2, and one third pixel P3 which are adjacent to each other may collectively function as a unit for displaying an image on the organic light-emitting display device 100.

Figure 2:
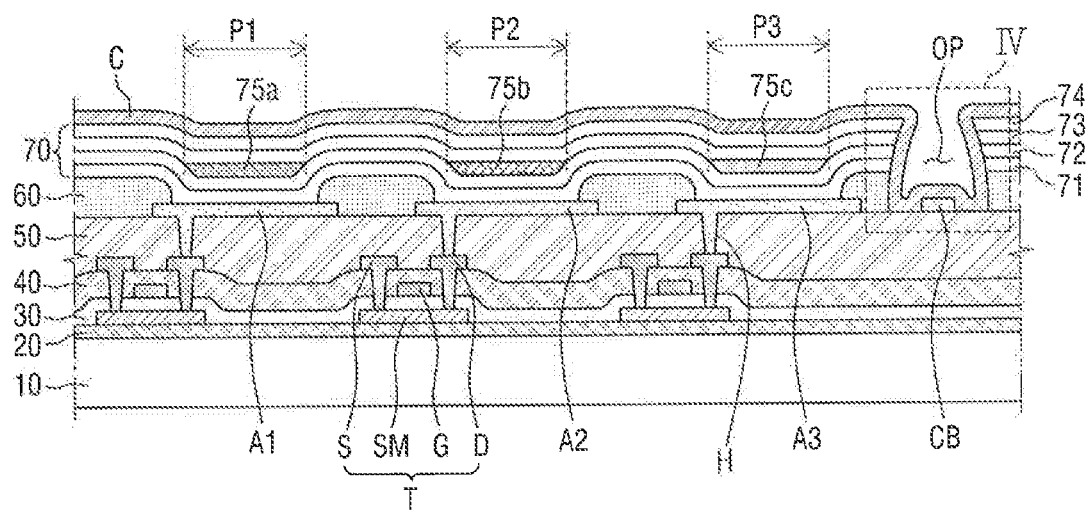
FIG. 2 is a cross-sectional view of the organic light-emitting display device taken along the line II-II' of FIG. 1.

The organic light-emitting display device 100 will now be described in more detail with reference to FIG. 2. FIG. 2 is a cross-sectional view of the organic light-emitting display device 100 taken along the line II-II' of FIG. 1.

Referring to FIG. 2, the organic light-emitting display device 100 includes a substrate 10, a plurality of anodes (A1, A2, A3), an auxiliary electrode CB, an organic layer 70, and a cathode C.

The substrate 10 is plate-shaped and supports other structures formed thereon. The substrate 10 may be formed of an insulating material such as, but is not limited to, glass, polyethylene terephthalate (PET), polycarbonate (PC), polyethersulfone (PES), polyimide (PI) or polymethylmethacrylate (PMMA). The substrate 10 may include a flexible material.

The anodes (A1, A2, A3) are formed on the substrate 10. Each of the anodes (A1, A2, A3) is connected to a thin-film transistor T which will be described later, and an electric current flowing through the organic layer 70 is controlled by a signal transmitted from the thin-film transistor T. The anodes (A1, A2, A3) may be reflective. For example, the anodes (A1, A2, A3) may be formed of materials including, but are not limited to, silver (Ag)/indium tin oxide (ITO), ITO/Ag/ITO, molybdenum (Mo)/ITO, aluminum (Al)/ITO, or titanium (Ti)/ITO. The anodes (A1, A2, A3) reflect light generated from the organic layer 70 in an upward direction.

The anodes (A1, A2, A3) include a first anode A1, a second anode A2, and a third anode A3. The first anode A1 is disposed in each of the first pixels P1, the second anode A2 is disposed in each of the second pixels P2, and the third anode A3 is disposed in each of the third pixels P3.

The auxiliary electrode CB is disposed on the substrate 10 and is separated from the anodes (A1, A2, A3). The auxiliary electrode CB is formed of substantially the same material as the anodes (A1, A2, A3). For example, the auxiliary electrode CB and the anodes (A1, A2, A3) may be simultaneously formed of substantially the same material by in the same process. However, the present invention is not limited thereto. The auxiliary electrode CB may be electrically connected to the cathode C.

The auxiliary electrode CB may be formed of a material with lower resistivity than the cathode C. The auxiliary electrode CB is electrically connected to the cathode C thereby reducing a voltage drop of a voltage applied to the cathode C due to the internal resistance of the cathode C.

Figure 3:
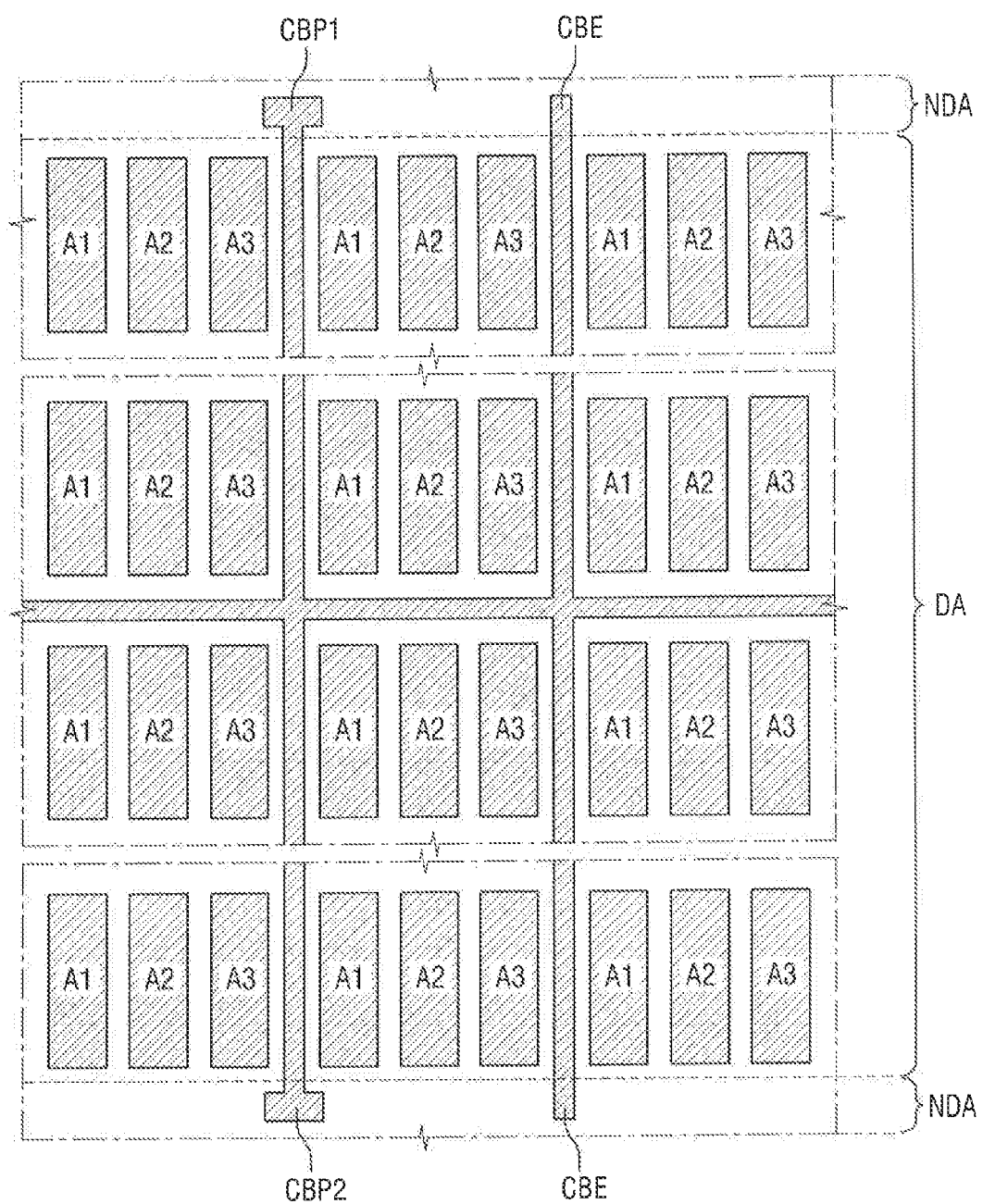
FIG. 3 is a plan view illustrating the arrangement of a plurality of anodes and an auxiliary electrode according to an exemplary embodiment of the present invention.

The anodes (A1, A2, A3) and the auxiliary electrode CB will now be described in more detail with reference to FIG. 3. FIG. 3 is a plan view of the organic light-emitting display device 100, illustrating an arrangement of the anodes (A1, A2, A3) and the auxiliary electrode CB according to an exemplary embodiment of the present invention.

Referring to FIG. 3, the arrangement of the anodes (A1, A2, A3) is substantially the same as the arrangement of the pixels (P1, P2, P3). The first anode A1 is disposed in the first pixel P1. The second anode A2 is disposed in the second pixel P2. The third anode A3 is disposed in the third pixel P3.

The auxiliary electrode CB is arranged in a meshed structure. One first anode A1, one second anode A2 and one third anode A3 are disposed inside a space surrounded by the auxiliary electrode CB. The auxiliary electrode CB is disposed between two neighboring anodes (A1, A2, A3). However, the present invention is not limited thereto, and the shape of the auxiliary electrode CB may vary.

The auxiliary electrode CB includes a plurality of end portions CBE. The end portions CBE are disposed in a non-display area NDA. The end portions CBE are regions of the auxiliary electrode CB which extend to the non-display area NDA. The organic light-emitting display device 100 includes a display area DA which displays an image and the non-display area NDA which surrounds the display area DA. The pixels (P1, P2, P3) and a plurality of pixel electrodes (i.e., the anodes (A1, A2, A3)) are arranged in the display area DA, and the non-display area NDA may surround the outside of the display area DA.

To form the opening OP in the organic layer 70, a voltage may be applied between two end portions CBE disposed adjacent to both sides of the display area DA. To apply a voltage to the end portions CBE, a pixel defining layer 60 which will be described later need not be formed on the end portions CBE.

The end portions CBE may be pad portions (CBP1, CBP2) formed by increasing a width of the auxiliary electrode CB. All of the end portions CBE may be the pad portions (CBP1, CBP2). However, the present invention is not limited thereto, and only some of the end portions CBE may be the pad portions (CBP1, CBP2). Since the pad portions (CBP1, CBP2) are formed by increasing the width of the auxiliary electrode CB, a voltage may be applied to the auxiliary electrode CB by applying the voltage to the pad portions (CBP1, CBP2). The pad portions (CBP1, CBP2) include a first pad portion CBP1 and a second pad portion CBP2 which are formed at different end portions CBE. The display area DA is disposed between the first pad portion CBP1 and the second pad portion CBP2. An electric potential is applied between the first pad portion CBP1 and the second pad portion CBP2, and thus an electric current flows evenly through all regions of the auxiliary electrode CB. Accordingly, heat may be generated evenly from the auxiliary electrode CB, thereby forming a plurality of openings OP. Each opening OP may have substantially the same size as other openings.

Referring to FIG. 2, the organic layer 70 is interposed between the anodes (A1, A2, A3) and the cathode C. The organic layer 70 emits light having a luminance level corresponding to an electric current flowing between the anodes (A1, A2, A3) and the cathode C.

The auxiliary electrode CB is disposed in the opening OP where the organic layer 70 does not exist on the substrate 10. The auxiliary electrode CB and the cathode C is electrically connected to each other. The opening OP will be described in more detail later with reference to FIG. 4.

The organic layer 70 includes a hole injection layer 71, a hole transport layer 72, an electron transport layer 73, an electron injection layer 74, and organic light-emitting layers (75a, 75b, 75c).

When an electric field is applied between the anodes (A1, A2, A3) and the cathode C, electrons are supplied from the cathode C to the organic light-emitting layers (75a, 75b, 75c) and holes are supplied from the anodes (A1, A2, A3) to the organic light-emitting layers (75a, 75b, 75c).

For example, the holes supplied from the anodes (A1, A2, A3) are injected into the hole injection layer 71 disposed on the anodes (A1, A2, A3). The injected holes are transported to the organic light-emitting layers (75a, 75b, 75c) through the hole transport layer 72. The hole transport layer 72 is disposed on the hole injection layer 71.

The electrons supplied from the cathode C are injected into the electron injection layer 74. The injected electrons are transported to the organic light-emitting layers (75a, 75b, 75c) through the electron transport layer 73. The electron injection layer 74 is disposed on the electron transport layer 73. The organic light-emitting layers (75a, 75b, 75c) are interposed between the electron transport layer 73 and the hole transport layer 72. The hole injection layer 71, the hole transport layer 72, the electron transport layer 73 and the electron injection layer 74 may be formed on the display area DA of the organic light-emitting display device 100. Such layers 71 to 74 need not be subject to a patterning process using a mask. Alternatively, such layers 71 to 74 may be patterned using a mask.

The organic layer 70 is not limited to have such four layers 71 to 74. For example, at least one layer of the hole injection layer 71, the hole transport layer 72, the electron transport layer 73 and the electron injection layer 74 may be omitted from the organic layer 70. The organic layer 70 may include only one layer among the hole injection layer 71, the hole transport layer 72, the electron transport layer 73, and the electron injection layer 74.

The organic light-emitting layers (75a, 75b, 75c) are disposed between the hole transport layer 72 and the electron transport layer 73. Each of the organic light-emitting layers (75a, 75b, 75c) emits light having a luminance level corresponding to the magnitude of an electric current flowing therethrough in response to an electric field applied between the anodes (A1, A2, A3) and the cathode C. The organic light-emitting layers (75a, 75b, 75c) may emit light corresponding to the energy generated by a change in an energy level of excitons formed by the combination of holes and electrons. The organic light-emitting layers (75a, 75b, 75c) are formed on the anodes (A1, A2, A3) by a deposition or printing method using a mask. The organic light-emitting layers (75a, 75b, 75c) are not be exposed through the opening OP. Therefore, the organic light-emitting layers (75a, 75b, 75c) need not contact the cathode C through the opening OP.

The organic light-emitting layers (75a, 75b, 75c) include a first organic light-emitting layer 75a, a second organic light-emitting layer 75b, and a third organic light-emitting layer 75c. The first organic light-emitting layer 75a is disposed on the first anode A1 and may emit red light. The second organic light-emitting layer 75b is disposed on the second anode A2 and may emit green light. The third organic light-emitting layer 75c is disposed on the third anode A3 and may emit blue light.

Figure 4:
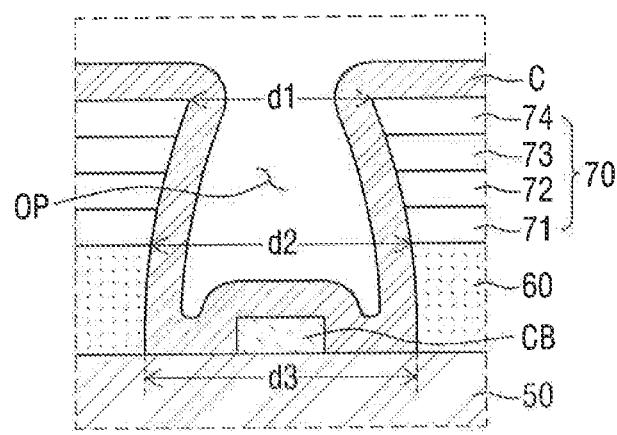
FIG. 4 is an enlarged view of a region IV of FIG. 2.

The opening OP will now be described in more detail with reference to FIG. 4. FIG. 4 is an enlarged view of a region IV of FIG. 2. Referring to FIG. 4, a width d1 of the opening OP at a top surface of the organic layer 70 is smaller than a width d2 of the opening OP at a bottom surface of the organic layer 70. To form the opening OP, a voltage is applied to the auxiliary electrode CB. The auxiliary electrode CB generates heat corresponding to the applied voltage, and the heat evaporates the organic layer 70 thereby the opening OP being formed on the auxiliary electrode CB. The heat is transferred through the organic layer 70. The organic layer 70 has a temperature distribution where the temperature is decreased from the auxiliary electrode CB to a top surface of the organic layer 70. Accordingly, the width d1 of the opening OP at the top surface of the organic layer 70 is smaller than the width d2 of the opening OP at the bottom surface of the organic layer 70 which is closer to the auxiliary electrode CB than the top surface of the organic layer 70.

Referring to FIG. 2, the cathode C is disposed on the organic layer 70. The cathode C is connected to the auxiliary electrode CB in the opening OP. The cathode C is formed on the display area DA of the organic light-emitting display device 100 without using a mask. The cathode C may be formed of an optically transparent or semi-transparent conductive material including, but is not limited to, indium tin oxide (ITO), indium zinc oxide (IZO), a compound of magnesium (Mg) and Ag, a compound of calcium (Ca) and Ag, or a compound of lithium (Li) and Al. Light generated from the organic layer 70 is emitted to the outside of the organic light-emitting display device 100 through the cathode C. To increase light transmittance of the cathode C, the cathode C may be formed thin. For example, the cathode C may have a thickness of 200 Å or less.

The cathode C may have relatively high resistance to an extent that the cathode C corresponding to each pixel (P1, P2, P3) may have a different voltage. For example, when a voltage is applied to the cathode, the voltage suffers from a voltage drop due to the resistance of the cathode C. Accordingly, each pixel may have a different cathode voltage. Such voltage difference may cause luminance stains on the organic light emitting display device 100. The auxiliary electrode CB has a lower resistance than the cathode C, and thus the combined resistance of the cathode C and the auxiliary electrode CB may reduce a voltage drop of the cathode C.

The organic light-emitting display device 100 further includes a buffer layer 20, a semiconductor layer SM, a gate insulating layer 30, a gate electrode G, an interlayer insulating film 30, a source electrode S, a drain electrode D, a planarization layer 50, and the pixel defining layer 60.

The buffer layer 20 is formed on a top surface of the substrate 10. The buffer layer 20 may prevent the penetration of impurity elements and planarize the top surface of the substrate 10. The buffer layer 20 may be formed of various materials that may perform the above functions. For example, the buffer layer 20 may include, but is not limited to, a silicon nitride ($SiN_x$) layer, a silicon oxide ($SiO_2$) layer, or a silicon oxynitride ($SiO_xN_y$) layer. Alternatively, the buffer layer 20 may be omitted.

The semiconductor layer SM is formed on the buffer layer 20. The semiconductor layer SM may include an amorphous silicon layer or a polycrystalline silicon layer. The semiconductor layer SM may include a channel region, a source region and a drain region. The source region is disposed on one side of the channel region, and the drain region is disposed on the other side of the channel region. The source region may be electrically connected to the source electrode S, and the drain region may be electrically connected to the drain electrode D. The source and drain regions may be highly doped with P-type impurities such as $B_2H_6$. The kind of impurities used to dope the semiconductor layer SM may be different according to exemplary embodiments.

Alternatively, the organic light emitting display device 100 may include an oxide semiconductor layer in place of the semiconductor layer SM. The gate insulating layer 30 is formed on the semiconductor layer SM. The gate insulating layer 30 may insulate the gate electrode G from the semiconductor layer SM. The gate insulating layer 30 may be formed of $SiN_x$ or $SiO_2$.

The gate electrode G is disposed on the gate insulating layer 30. The gate electrode G overlaps at least a region of the semiconductor layer SM. A voltage applied to the gate electrode G may control the semiconductor layer SM to become conductive or non-conductive. For example, a relatively high voltage applied to the gate electrode G may control the semiconductor layer SM to become conductive, thereby electrically connecting the drain electrode D and the source electrode S to each other. A relatively low voltage applied to the gate electrode G may control the semiconductor layer SM to become non-conductive, thereby insulating the drain electrode D and the source electrode S from each other.

The interlayer insulating film 40 is formed on the gate electrode G. The interlayer insulating film 40 covers the gate electrode G to insulate the gate electrode G from the source electrode S and the drain electrode D. The interlayer insulating film 40 may be formed of $SiN_x$ or $SiO_2$.

The source electrode S and the drain electrode D are disposed on the interlayer insulating film 40. The source electrode S and the drain electrode D penetrate the interlayer insulating film 40 and the gate insulating layer 30 to contact the source region S and the drain region D, respectively. The source electrode S, the drain electrode D, the gate electrode G, and the semiconductor layer SM may form the thin-film transistor T. The thin-film transistor T may determine whether to deliver a signal, which is transmitted to the source electrode S, to the drain electrode D according to a voltage applied to the gate electrode G.

The planarization layer 50 is disposed on the thin-film transistor T and the interlayer insulating film 40. To increase the light emission efficiency of the organic layer 70 disposed on the planarization layer 50, a top surface of the planarization layer 50 is flat without a step. The planarization layer 50 may be formed of an insulating material including, but is not limited to, polyacrylates resin, epoxy resin, phenolic resin, polyamides resin, polyimides resin, unsaturated polyesters resin, poly phenylenethers resin, poly phenylenesulfides resin, or benzocyclobutene (BCB). A contact hole H is formed in the planarization layer 50 to expose a top surface of the drain electrode D of the thin-film transistor T which will be described later. The cathode C and the drain electrode D is electrically connected to each other through the contact hole H.

The pixel defining layer 60 is disposed on the planarization layer 50. The pixel defining layer 60 partially covers the anodes (A1, A2, A3) to expose top surfaces of the anodes (A1, A2, A3). Regions respectively including the pixel electrodes (i.e., the anodes (A1, A2, A3)) uncovered by the pixel defining layer 60 and the organic layer 70 and the cathode C disposed on the pixel electrodes (i.e., the anodes (A1, A2, A3)) may be defined as the pixels (P1, P2, P3). The pixel defining layer 60 covers the auxiliary electrode CB. The opening OP penetrates the pixel defining layer 60 to expose the auxiliary electrode CB.

Referring to FIG. 4, the width d2 of the opening OP at the top surface of the pixel defining layer 60 is smaller than a width d3 of the opening OP at a bottom surface of the pixel defining layer 60. When the voltage is applied to the auxiliary electrode CB, the pixel defining layer 60 is also evaporated due to the heat generated from the auxiliary electrode CB. The organic layer 70 and the pixel defining layer 60 have a temperature distribution where the temperature is decreased from the auxiliary electrode CB to the top surface of the organic layer 70. Accordingly, the width d2 of the opening OP at the top surface of the pixel defining layer 60 is smaller than the width d3 of the opening OP at the bottom surface of the pixel defining layer 60 which is closer to the auxiliary electrode CB than the top surface of the pixel defining layer 60.

The width d1 of the opening OP at the top surface of the organic layer 70 is smaller than the width d2 of the opening OP at the bottom surface of the organic layer 70. When the voltage is applied to the auxiliary electrode CB, the organic layer 70 may be evaporated due to the heat generated from the auxiliary electrode CB. The organic layer 70 and the pixel defining layer 60 have the temperature distribution where the temperature is decreased from the auxiliary electrode CB to the top surface of the organic layer 70. Accordingly, the width d1 of the opening OP at the top surface of the organic layer 70 is smaller than the width d2 of the opening OP at the bottom surface of the organic layer 70 which is closer to the auxiliary electrode CB than the top surface of the organic layer 70.

Figure 5:
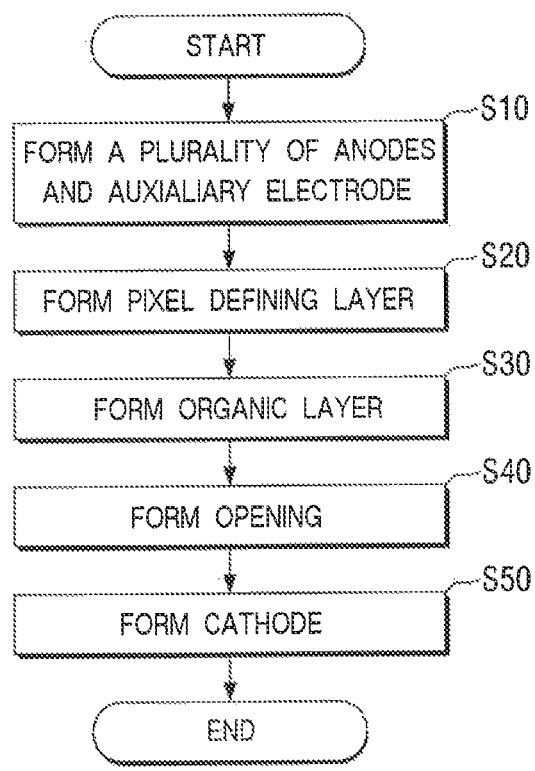
FIG. 5 is a flowchart illustrating a method of manufacturing an organic light-emitting display device according to an exemplary embodiment of the present invention.

A method of manufacturing the organic light-emitting display device 100 will now be described with reference to FIG. 5. FIG. 5 is a flowchart illustrating a method of manufacturing an organic light-emitting display device according to an exemplary embodiment of the present invention.

Referring to FIG. 5, the method of manufacturing the organic light-emitting display device 100 includes forming a plurality of anodes (A1, A2, A3) and an auxiliary electrode CB (operation S10), forming a pixel defining layer 60 (operation S20), forming an organic layer 70 (operation S30), forming an opening OP (operation S40), and forming a cathode C (operation S50).

Figure 6:
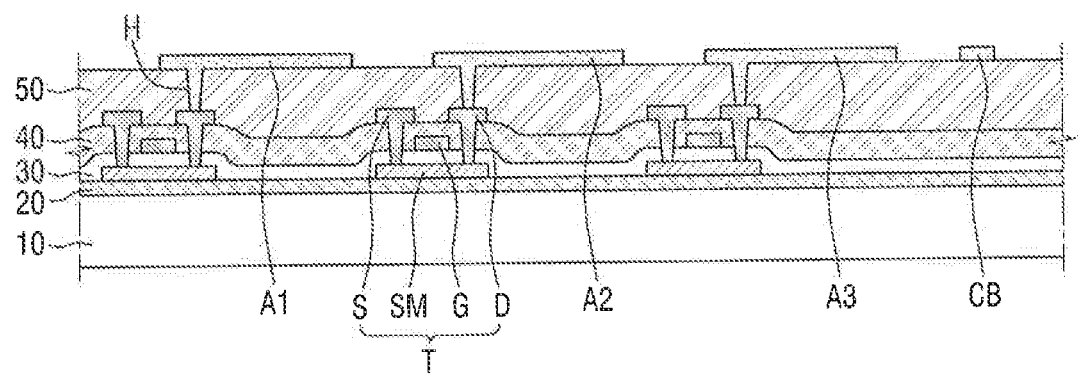
FIG. 6 is a cross-sectional view of the organic light-emitting display device, illustrating an operation of forming a plurality of anodes and an auxiliary electrode according to an exemplary embodiment of the present invention.

The forming of the anodes (A1, A2, A3) and the auxiliary electrode CB (operation S10) will now be described with reference to FIG. 6. FIG. 6 is a cross-sectional view of the organic light-emitting display device 100, illustrating the forming of the anodes (A1, A2, A3) and the auxiliary electrode CB (operation S10) according to an exemplary embodiment of the present invention. Referring to FIG. 6, the anodes (A1, A2, A3) and the auxiliary electrode CB are formed on a substrate 10 in operation S10. A buffer layer 20, a gate insulating layer 30, an interlayer insulating film 40, a planarization layer 50, a semiconductor layer SM, a gate electrode G, a source electrode S and a drain electrode D are formed on the substrate 10, and the anodes (A1, A2, A3) and the auxiliary electrode CB are formed on the planarization layer 50. The anodes (A1, A2, A3) are separated from each other. The drain electrode D is connected to its corresponding anode (A1, A2, A3) through a contact hole H formed in the planarization layer 50. The auxiliary electrode CB is separated from the anodes (A1, A2, A3). The auxiliary electrode CB and the anodes (A1, A2, A3) may be formed of substantially the same material. The auxiliary electrode CB and the anodes (A1, A2, A3) may be simultaneously formed using a deposition process using the same mask.

Figure 7:
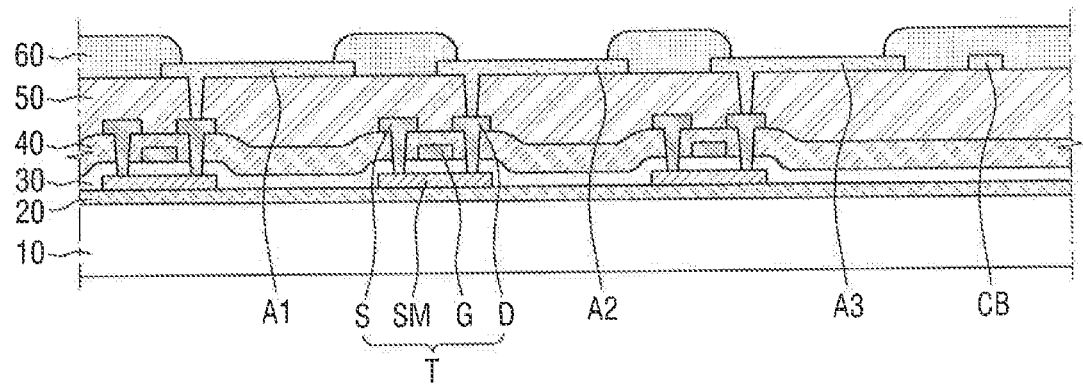
FIG. 7 is a cross-sectional view of the organic light-emitting display device, illustrating an operation of forming a pixel defining layer according to an exemplary embodiment of the present invention.

The forming of the pixel defining layer 60 (operation S20) will now be described with reference to PIG. 7. FIG. 7 is a cross-sectional view of the organic light-emitting display device 100, illustrating the thrilling of the pixel defining layer 60 (operation S20) according to an exemplary embodiment of the present invention. The pixel defining layer 60 is formed on the substrate 10 and the planarization layer 50. The pixel defining layer 60 partially covers the anodes (A1, A2, A3), but the present invention is not limited thereto. The pixel defining layer 60 partially exposes top surfaces of the anodes (A1, A2, A3). The pixel defining layer 60 covers the auxiliary electrode CB. The pixel defining layer 60 need not be formed in a non-display area NDA. The pixel defining layer 60 need not be formed on end portions CBE of the auxiliary electrode CB which are disposed in the non-display area NDA.

The forming of the organic layer 70 (operation S30) will now be described with reference to FIGS. 8 through 11.

Figure 8:
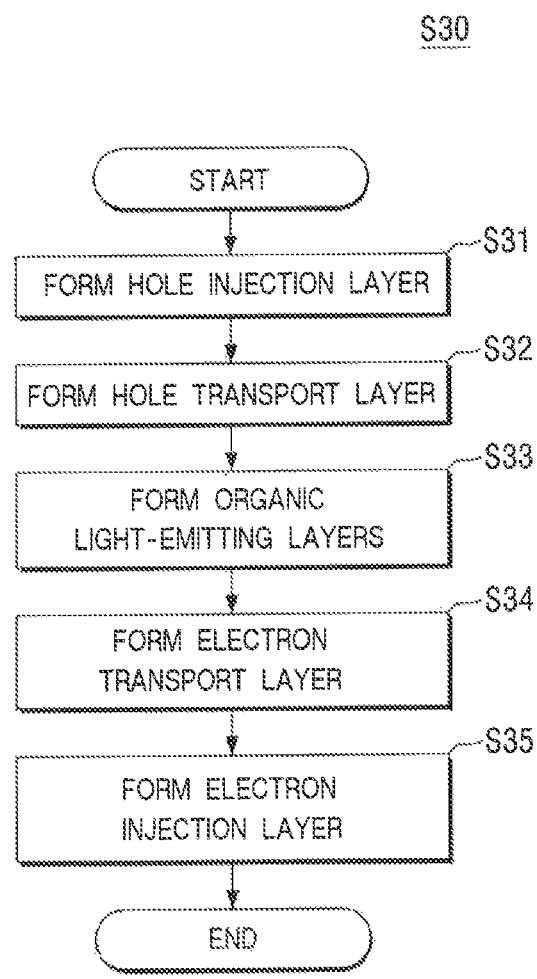
FIG. 8 is a flowchart illustrating an operation of forming an organic layer according to an exemplary embodiment of the present invention.

FIG. 8 is a flowchart illustrating the forming of the organic layer 70 (operation S30) according to an exemplary embodiment of the present invention. Referring to FIG. 8, the forming of the organic layer 70 (operation S30) includes forming a hole injection layer 71 (operation S31), forming a hole transport layer 72 (operation S32), forming organic light-emitting layers (75a, 75b, 75c) (operation S33), forming an electron transport layer 73 (operation 34), and forming an electron injection layer 74 (operation S35).

Figure 9:
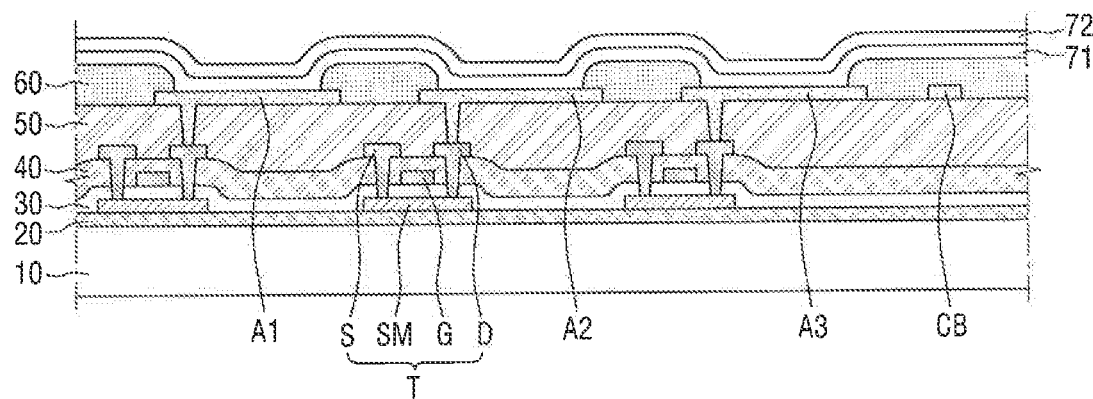
FIG. 9 is a cross-sectional view of the organic light-emitting display device, illustrating an operation of forming a hole injection layer and an operation of forming a hole transport layer according to an exemplary embodiment of the present invention.

The forming of the hole injection layer 71 (operation S31) and the forming of the hole transport layer 72 (operation S32) will now be described with reference to FIG. 9. FIG. 9 is a cross-sectional view of the organic light-emitting display device 100, illustrating the forming of the hole injection layer 71 (operation S31) and the forming of the hole transport layer 72 (operation S32) according to an exemplary embodiment of the present invention. Referring to FIG. 9, in the forming of the hole injection layer 71 (operation S31), the hole injection layer 71 is formed on the anodes (A1, A2, A3), the pixel defining layer 60, and the auxiliary electrode CB. The hole injection layer 71 may be formed on the display area DA without using a mask. The hole injection layer 71 need not be formed in the non-display area NDA. The hole injection layer 71 need not be formed on the end portions CBE of the auxiliary electrode CB which are disposed in the non-display area NDA.

In the forming of the hole transport layer 72 (operation S32), the hole transport layer 72 is formed on the hole injection layer 71. The hole transport layer 72 is formed on the display area DA without using a mask. The hole transport layer 72 need not be formed in the non-display area NDA. The hole transport layer 72 need not be formed on the end portions CBE of the auxiliary electrode CB which are disposed in the non-display area NDA.

Figure 10:
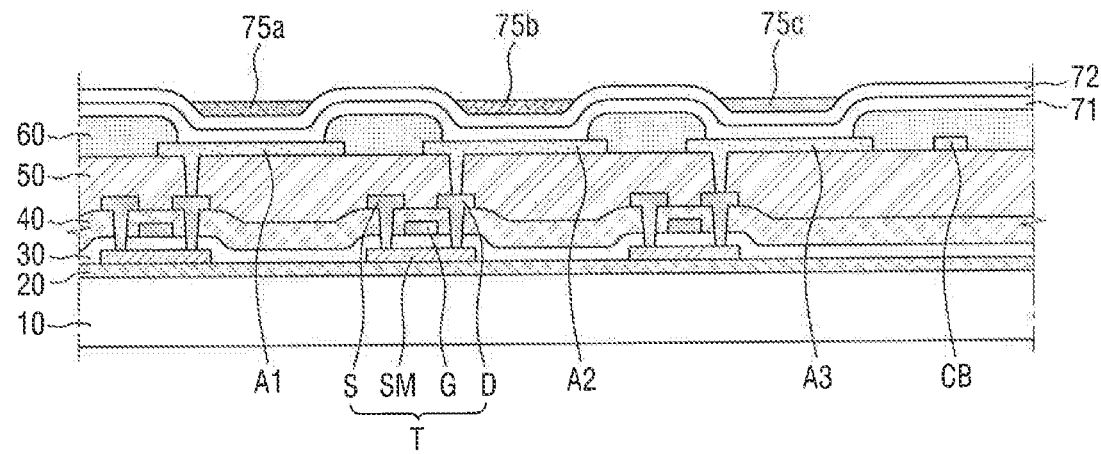
FIG. 10 is a cross-sectional view of the organic light-emitting display device, illustrating an operation of forming organic light-emitting layers according to an exemplary embodiment of the present invention.

The forming of the organic light-emitting layers (75a, 75b, 75c) (operation S33) will now be described with reference to FIG. 10. FIG. 10 is a cross-sectional view of the organic light-emitting display device 100, illustrating the forming of the organic light-emitting layers (75a, 75b, 75c) according to an exemplary embodiment of the present invention. Referring to FIG. 10, in the forming of the organic light-emitting layers (75a, 75b, 75c) (operation S33), first through third organic light-emitting layers 75a through 75c may be formed on first through third anodes A1 through A3 and the hole transport layer 72, respectively. Each of the first through third organic light-emitting layers 75a through 75c may be formed using an inkjet printing method or a deposition method using a mask.

Figure 11:
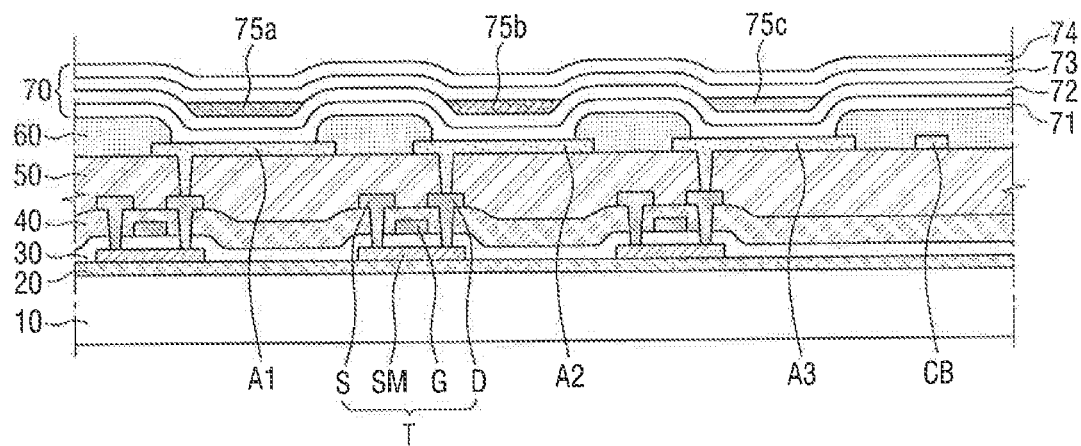
FIG. 11 is a cross-sectional view of the organic light-emitting display device, illustrating an operation of forming an electron transport layer and an operation of forming an electron injection layer according to an exemplary embodiment of the present invention.

The forming of the electron transport layer 73 (operation S34) and the forming of the electron injection layer 74 (operation S35) will now be described with reference to FIG. 11. FIG. 11 is a cross-sectional view of the organic light-emitting display device 100, illustrating the forming of the electron transport layer 73 (operation S34) and the forming of the electron injection layer 74 (operation S35) according to an exemplary embodiment of the present invention. Referring to FIG. 11, in the forming of the electron transport layer 73 (operation S34), the electron transport layer 73 is formed on the hole transport layer 72 and the organic light-emitting layers (75a, 75b, 75c). The electron transport layer 73 is formed on the display area DA without using a mask. The electron transport layer 73 need not be formed in the non-display area NDA. The electron transport layer 73 need not be formed on the end portions CBE of the auxiliary electrode CB which are disposed in the non-display area NDA.

In the forming of the electron injection layer 74 (operation S35), the electron injection layer 74 is formed on the electron transport layer 73. The electron injection layer 74 is formed on the display area DA without using a mask. The electron injection layer 74 need not be formed in the non-display area NDA. The electron injection layer 74 need not be formed on the end portions CBE of the auxiliary electrode CB which are disposed in the non-display area NDA.

If the hole injection layer 71, the hole transport layer 72, the electron transport layer 73 or the electron injection layer 74 is omitted from the organic light-emitting display device 100, the operation of forming the omitted layer need not be performed.

Figure 12:
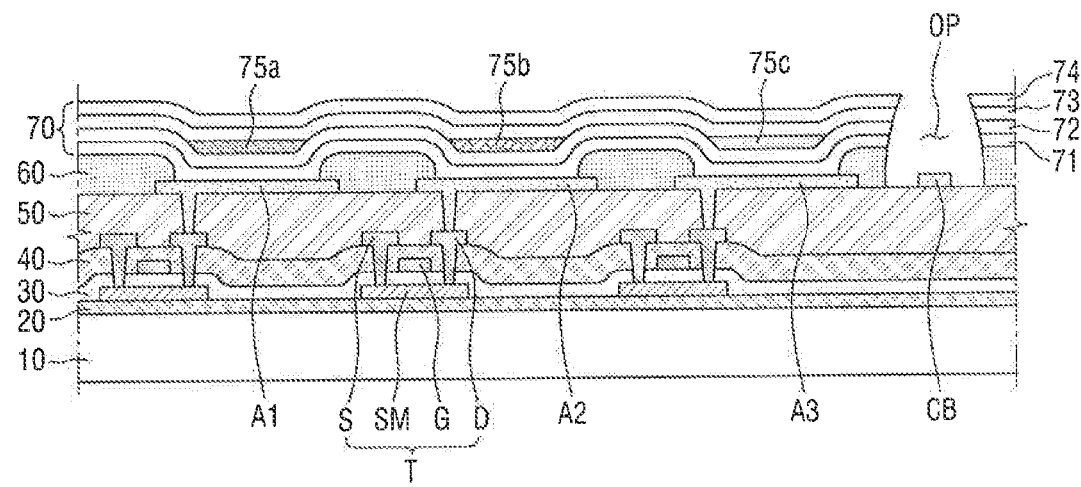
FIG. 12 is a cross-sectional view of the organic light-emitting display device, illustrating an operation of forming an opening in the organic layer according to an exemplary embodiment of the present invention.

The forming of the opening OP (operation S40) will now be described with reference to FIG. 12. FIG. 12 is a cross-sectional view of the organic light-emitting display device 100, illustrating the forming of the opening OP in the organic layer 70 (operation S40) according to an exemplary embodiment of the present invention. Referring to FIG. 12, in the forming of the opening OP (operation S40), a voltage may be applied to the auxiliary electrode CB, and heat generated from the auxiliary electrode CB by the voltage applied to the auxiliary electrode CB may cause a portion of the pixel defining layer 60 and a portion of the organic layer 70 which are adjacent to the auxiliary electrode CB to evaporate, thereby forming the opening OP. The voltage applied to the auxiliary electrode CB may be high enough to generate heat that evaporates the pixel defining layer 60 and the organic layer 70. The voltage applied to the auxiliary electrode CB may be, for example, 15,000 V or higher. The voltage may be applied to the auxiliary electrode CB by applying different electric potentials to two end portions CBE of the auxiliary electrode CB. The two end portions CBE may be in the non-display areas NDA facing each other. If an electric potential is applied between the two end portions CBE disposed in the non-display areas NDA facing each other, an electric current may flow evenly through all regions of the auxiliary electrode CB. Accordingly, heat may be generated evenly from the auxiliary electrode CB, thereby forming a plurality of openings OP. Each opening OP has substantially the same size with other openings. An electric potential may also be applied between two pad portions (CBP1, CBP2) (that is, two end portions CBE of another type) which are wide and thus may be contacted using a tool for applying electric potentials.

In the method of manufacturing the organic light-emitting display device 100 according to an exemplary embodiment, the opening OP where the cathode C is connected to the auxiliary electrode CB may be formed by applying a voltage to the auxiliary electrode CB. Therefore, the opening OP may be formed through the hole injection layer 71, the hole transport layer 72, the electron transport layer 73, and the electron injection layer 74 without using an etching process. Accordingly, the method of manufacturing the organic light-emitting display device 100 according to an exemplary embodiment does not require the use of a mask in forming the hole injection layer 71, the hole transport layer 72, the electron transport layer 73 or the electron injection layer 74 nor in forming the opening OP using an etching process. This may simplify the process of manufacturing an organic light-emitting display device according to an exemplary embodiment.

In the forming of the cathode C (operation S50), the cathode C is formed on the organic layer 70. The cathode C is electrically connected to the auxiliary electrode CB in the opening OP. The cathode C may be formed on the display area DA without using a mask. The forming of the cathode C (operation S50) may produce the organic light-emitting display device 100 of FIG. 2.

Figure 13:
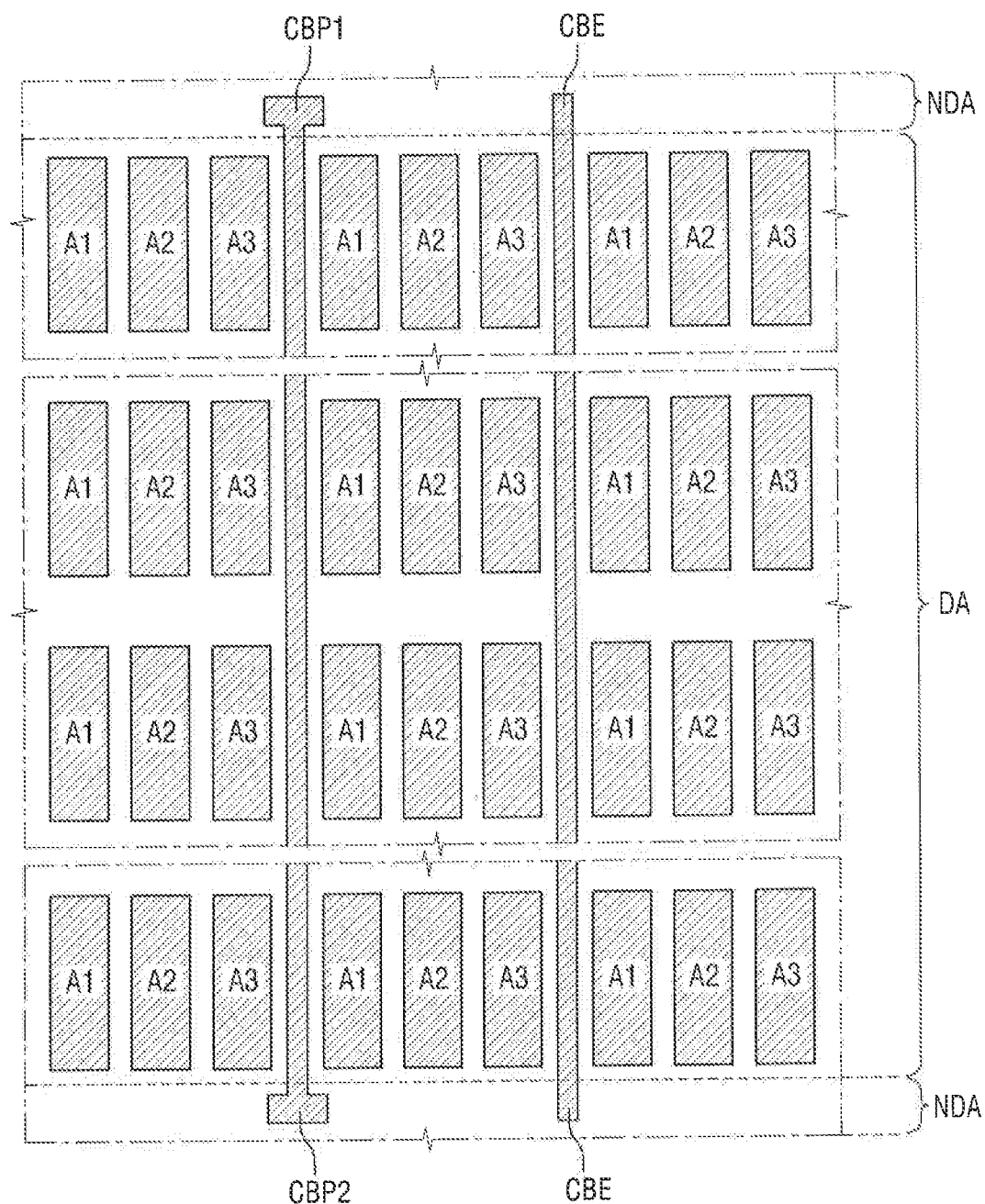
FIG. 13 is a plan view illustrating an arrangement of a plurality of anodes and an auxiliary electrode according to an exemplary embodiment of the present invention.

An exemplary embodiment of the present invention will now be described with reference to FIG. 13. FIG. 13 is a plan view illustrating the arrangement of a plurality of anodes (A1, A2, A3) and an auxiliary electrode CB according to an exemplary embodiment of the present invention. The auxiliary electrode CB may be formed of stripe patterns. The auxiliary electrode CB may include a plurality of straight lines which are separated from each other. End portions CBE of the auxiliary electrode CB may be, but are not limited to, pad portions (CBP1, CBP2). If the auxiliary electrode CB is formed as a plurality of stripe patterns, a voltage may be applied to each of the stripe patterns to form an opening OP in the forming of the opening OP (operation S40).

Figure 14:
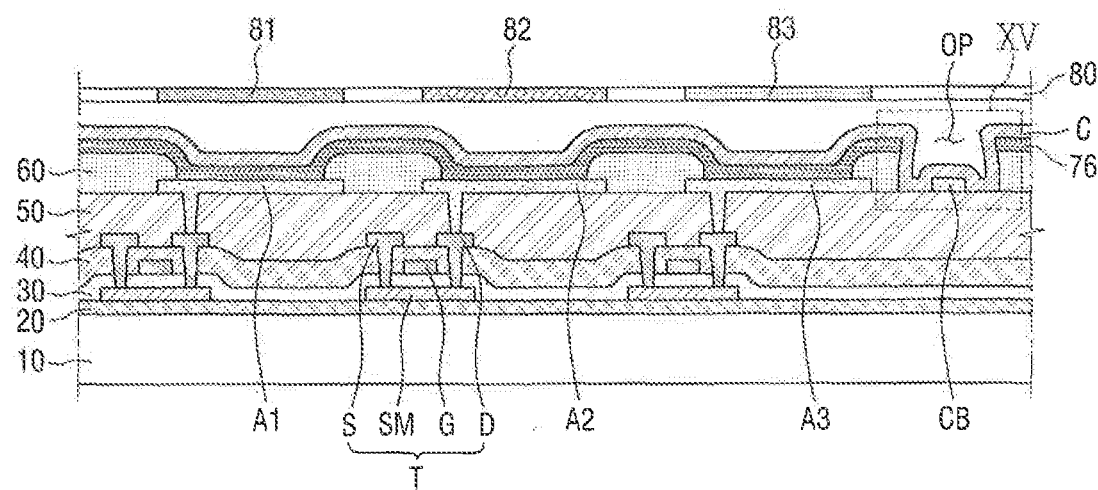
FIG. 14 is a cross-sectional view of an organic light-emitting display device according to an exemplary embodiment of the present invention.
Figure 15:
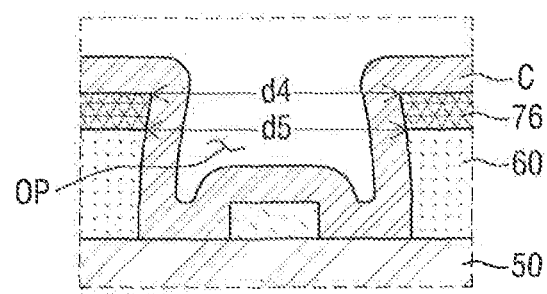
FIG. 15 is an enlarged view of a region XV of FIG. 14.

An exemplary embodiment of the present invention will now be described with reference to FIGS. 14 and 15. FIG. 14 is a cross-sectional view of an organic light-emitting display device 101 according to an exemplary embodiment of the present invention. FIG. 15 is an enlarged view of a region XV of FIG. 14. A plan view of the organic light-emitting display device 101 according to an exemplary embodiment is substantially the same as that of FIG. 1, and FIG. 14 is a cross-sectional view taken along substantially the same line as the line of FIG. 1.

Referring to FIG. 14, the organic light-emitting display device 101 includes a white organic light-emitting layer 76 as an organic layer. The white organic light-emitting layer 76 emits white light at a luminance level corresponding to an electric current flowing therethrough. The white organic light-emitting layer 76 may contain materials that emit red light, blue light and green light, respectively. An opening OP is formed in the white organic light-emitting layer 76 and a pixel defining layer 60, and an auxiliary electrode CB is exposed through the opening OP. The opening OP will now be described in more detail with reference to FIG. 15.

Referring to FIG. 15, a width d4 of the opening OP at a top surface of the white organic light-emitting layer 76 is smaller than a width d5 of the opening OP at a bottom surface of the white organic light-emitting layer 76. When the opening OP is formed in the white organic light-emitting layer 76 by applying a voltage to the auxiliary electrode CB, the white organic light-emitting layer 76 is evaporated by heat generated from the auxiliary electrode CB. The white organic light-emitting layer 76 has a temperature distribution where the temperature is decreased from the auxiliary electrode CB to a top surface of the white organic light-emitting layer 70. Accordingly, the width d4 of the opening OP at the top surface of the white organic light-emitting layer 76 is smaller than the width d5 of the opening OP at the bottom surface of the white organic light-emitting layer 76 which is closer to the auxiliary electrode CB than the top surface of the white organic light-emitting layer 76.

Referring to FIG. 14, the organic light-emitting display device 101 further includes a color filter layer 80. The color filter layer 80 is disposed on a cathode C. The color filter layer 80 includes a first color filter 81, a second color filter 82 and a third color filter 83 of different colors. The first color filter 81 is disposed on a first pixel electrode (i.e., a first anode A1), the second color filter 82 is disposed on a second pixel electrode (i.e., a second anode A2), and the third color filter 83 is disposed on a third pixel electrode (i.e., a third anode A3). The first color filter 81 may be, but is not limited to, a red color filter, the second color filter 82 may be, but is not limited to, a green color filter, and the third color filter 83 may be, but is not limited to, a blue color filter.

Figure 16:
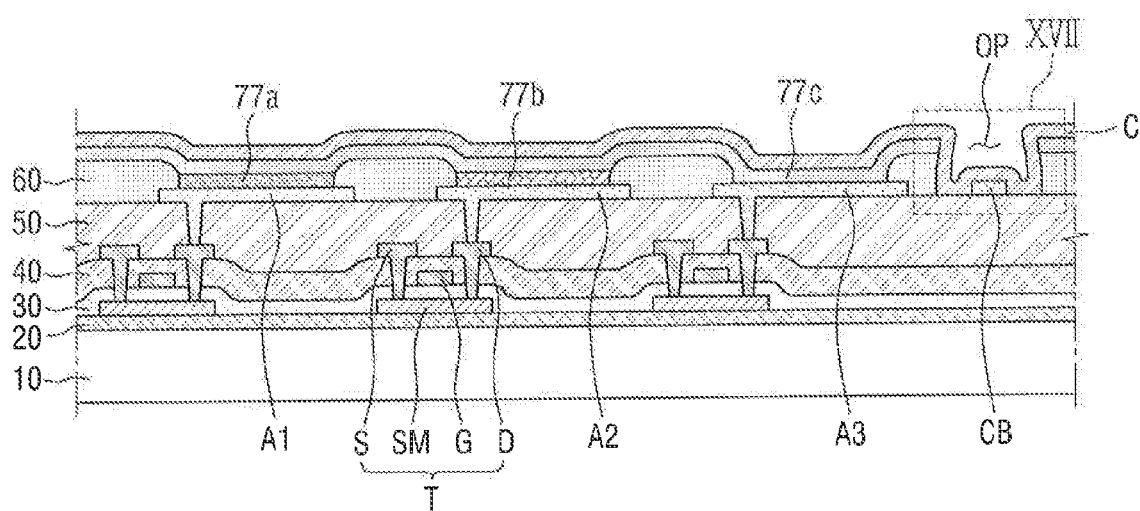
FIG. 16 is a cross-sectional view of an organic light-emitting display device according to an exemplary embodiment of the present invention.
Figure 17:
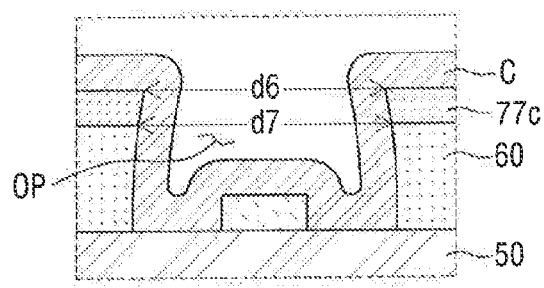
FIG. 17 is an enlarged view of a region XVII of FIG. 16.
Figure 18:
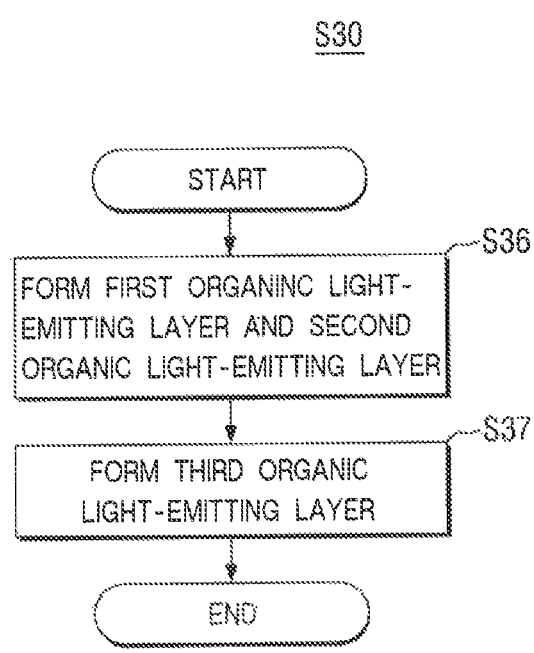
FIG. 18 is a flowchart illustrating a method of manufacturing an organic light-emitting display device according to an exemplary embodiment of the present invention.

An exemplary embodiment of the present invention will now be described with reference to FIGS. 16 through 18. FIG. 16 is a cross-sectional view of an organic light-emitting display device 102 according to an exemplary embodiment of the present invention. FIG. 17 is an enlarged view of a region XVII of FIG. 16. FIG. 18 is a flowchart illustrating the forming of an organic layer according to an exemplary embodiment of the present invention. A plan view of the organic light-emitting display device 102 according to an exemplary embodiment is substantially the same as that of FIG. 1, and FIG. 16 is a cross-sectional view taken along substantially the same line as the line II-II' of FIG. 1.

Referring to FIG. 16, the organic light-emitting display device 102 includes a first organic light-emitting layer 77a, a second organic light-emitting layer 77b, and a third organic light-emitting layer 77c as an organic layer. The first through third organic light-emitting layers 77a through 77c may emit light of different colors. For example, the first organic light-emitting layer 77a may emit red light, the second organic light-emitting layer 77b may emit green light, and the third organic light-emitting layer 77c may emit blue light. However, the present invention is not limited thereto. The first organic light-emitting layer 77a is disposed on a first anode A1, and the second organic light-emitting layer 77b is disposed on a second anode A2. The third organic light-emitting layer 77c is disposed on the first through third anodes A1 through A3. For example, the first organic light-emitting layer 77a and the third organic light-emitting layer 77c are disposed on the first anode A1, and the second organic light-emitting layer 77b and the third organic light-emitting layer 77c are disposed on the second anode A2. Since regions of the third organic light-emitting layer 77c which are disposed on the first anode A1 and the second anode A2 do not emit light, the colors of light emitted from a first pixel P1 and a second pixel P2 are not affected from the third organic light-emitting layer 77c.

An opening OP is formed in the third organic light-emitting layer 77c and a pixel defining layer 60. An auxiliary electrode CB is exposed through the opening OP, and the auxiliary electrode CB is electrically connected to a cathode C. The opening OP will now be described in more detail with reference to FIG. 17. Referring to FIG. 17, a width d6 of the opening OP at a top surface of the third organic light-emitting layer 77c is smaller than a width d7 of the opening OP at a bottom surface of the third organic light-emitting layer 77c. When the opening OP is formed in the third organic light-emitting layer 77c by applying a voltage to the auxiliary electrode CB, the third organic light-emitting layer 77c is evaporated by heat generated from the auxiliary electrode CB. The organic layers 77a to 77c have a temperature distribution where the temperature is decreased from the auxiliary electrode CB to a top surface of the third organic light-emitting layer 77c. Accordingly, the width d6 of the opening OP at the top surface of the third organic light-emitting layer 77c is smaller than the width d7 of the opening OP at the bottom surface of the third organic light-emitting layer 77c which is closer to the auxiliary electrode CB than the top surface of the third organic light-emitting layer 77c.

A method of forming the organic layer of the organic light-emitting display device 102 will now be described with reference to FIG. 18. Referring to FIG. 18, the forming of the organic layer (operation S30) includes forming the first organic light-emitting layer 77a and the second organic light-emitting layer 77b (operation S36) and forming the third organic light-emitting layer 77c (operation S37).

In the forming of the first organic light-emitting layer 77a and the second organic light-emitting layer 77b (operation S36), the first organic light-emitting layer 77a is formed on the first anode A1, and the second organic light-emitting layer 77b is formed on the second anode A2 using an inkjet printing method or a deposition method using a mask.

In the forming of the third organic light-emitting layer 77c (operation S37), the third organic light-emitting layer 77c is formed on a display area DA without using a mask.

Alternatively, the first and second organic light-emitting layers 77a and 77b may be formed on the third organic light-emitting layer 77c. In this case, the forming of the third organic light-emitting layer 77c (operation S37) may be performed before the forming of the first organic light-emitting layer 77a and the second organic light-emitting layer 77b (operation S36).

According to an exemplary embodiment, the process of manufacturing an organic light-emitting display device may be simplified without using a mask for forming organic layer and/or an opening in the organic layer. In addition, an auxiliary electrode may reduce a voltage drop due to internal resistance of a cathode.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An organic light-emitting display device comprising:
a substrate;
a plurality of anodes disposed on the substrate;
an auxiliary electrode disposed on the substrate, spaced apart_from the plurality of anodes;
an organic layer disposed on the plurality of anodes;
an opening penetrating the organic layer to expose the auxiliary electrode; and
a cathode electrically connected to the auxiliary electrode through the opening, wherein the opening has a first width at a proximal end and a second width at a distal end, wherein the distal end is closer to the auxiliary electrode than the proximal end and the first width is smaller than the second width.

2. The display device of claim 1, wherein the organic layer comprises a plurality of organic light-emitting layers disposed on the plurality of anodes, each organic light-emitting layer being disposed on a corresponding anode of the plurality of anodes, and wherein the organic layer further comprises a hole transport layer disposed under the plurality of organic light-emitting layers, a hole injection layer disposed under the hole transport layer, an electron transport layer disposed on the plurality of organic light-emitting layers, or an electron injection layer disposed on the electron transport layer, wherein the opening does not penetrate the plurality of organic light-emitting layers.

3. The display device of claim 2, wherein the plurality of anodes comprises first, second, and third anodes which are spaced apart from each other, and the plurality of organic light--emitting layers comprises first, second, and third organic light-emitting layers which emit light of different colors from each other, wherein the first organic light-emitting layer is disposed on the first anode, the second organic light-emitting layer is disposed on the second anode, and the third organic light-emitting layer is disposed on the third anode.

4. The display device of claim 1, wherein the organic layer comprises a white organic light-emitting layer disposed on the plurality of anodes, and wherein the opening penetrates the white organic light-emitting layer.

5. The display device of claim 4, further comprising a plurality of color filters disposed on the cathode.

6. The display device of claim 1, wherein the plurality of anodes comprises first, second, and third anodes which are spaced apart from each other, wherein the organic layer comprises a first organic light-emitting layer disposed on the first anode, a second. organic light-emitting layer disposed on the second anode, and a third organic light-emitting layer disposed on the first organic light-emitting layer, the second light-emitting layer and the third anode, and wherein the opening penetrates the third organic light-emitting layer among the first, second, and third organic light-emitting layers.

7. The display device of claim 1, further comprising a pixel defining layer disposed between the substrate and the organic layer,
wherein the opening further penetrates the pixel defining layer,
wherein the opening has a third width at a first height from the distal end,
wherein a top surface of the pixel defining layer is positioned at substantially the same first height from the distal end, and
wherein the third width is smaller than the second width.

8. An organic light-emitting display device comprising:
a substrate including a display area and a non-display area;
a plurality of anodes disposed on the display area of the substrate; an auxiliary electrode disposed on both the display area and the non-display area of the substrate, the auxiliary electrode being separated from the plurality of anodes;
an organic layer disposed on the plurality of anodes;
an opening penetrating the organic layer to expose the auxiliary electrode; and
a cathode disposed on the organic layer and the exposed auxiliary electrode,
wherein the auxiliary electrode comprises end portions disposed in the non-display area.

9. The display device of claim 8, wherein the end portions include pads which are wider than the auxiliary electrode.

10. The display device of claim 8, wherein the organic layer comprises a plurality of organic light-emitting layers, each organic light-emitting layer being disposed on a corresponding anode of the plurality of anodes, wherein the organic layer further comprises a hole transport layer disposed under the plurality of organic light-emitting layers, a hole injection layer disposed under the hole transport layer, an electron. transport layer disposed on the plurality of organic light-emitting layers, or an electron injection layer disposed on the electron transport layer, wherein the opening does not penetrate the plurality of organic light-emitting layers.

11. The display device of claim 10, wherein the plurality of anodes comprises first, second, and third anodes which are separated from each other, wherein the organic layer comprises first, second, and third organic light-emitting layers which emit light of different colors from each other, and wherein the first organic light-emitting layer is disposed on the first anode, the second organic light-emitting layer is disposed on the second anode, and the third organic light-emitting layer is disposed on the third anode.

12. The display device of claim 8, wherein the organic layer comprises a white organic light-emitting layer disposed on the plurality of anodes, and wherein the opening penetrates the white organic light-emitting layer.

13. The display device of claim 12, further comprising a plurality of color filters disposed on the cathode.

14. The display device of claim 3, wherein the plurality of anodes comprises first, second and third anodes which are separated from each other, wherein the organic layer comprises a first organic light-emitting layer disposed on the first anode, a second organic light-emitting layer disposed on the second anode, and a third organic light-emitting layer disposed on the first organic light-emitting layer, the second organic light-emitting layer, and the third anode, and wherein the opening penetrates the third organic light-emitting layer among the first, second, and third organic light-emitting layers.

* * * * *